United States Patent
Koide et al.

(10) Patent No.: US 7,268,002 B2
(45) Date of Patent: Sep. 11, 2007

(54) PACKAGING METHOD, PACKAGING STRUCTURE AND PACKAGE SUBSTRATE FOR ELECTRONIC PARTS

(75) Inventors: Masateru Koide, Kawasaki (JP); Misao Umematsu, Kawasaki (JP); Takashi Kanda, Kawasaki (JP); Yasuhiro Usui, Kawasaki (JP); Kenji Fukuzono, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/265,107

(22) Filed: Nov. 3, 2005

(65) Prior Publication Data
US 2006/0063303 A1    Mar. 23, 2006

(30) Foreign Application Priority Data
Mar. 20, 2003    (JP)    ............... 2003-78354

(51) Int. Cl.
*H01L 21/66*    (2006.01)
*H01L 21/44*    (2006.01)

(52) U.S. Cl. .................. 438/15; 438/106; 438/E21.499

(58) Field of Classification Search ........ 438/106–108, 438/15, 25, 125; 257/E21.499, E21.519, 257/E21.505, E21.514
See application file for complete search history.

(56) References Cited

U.S. PATENT DOCUMENTS

| | | | | |
|---|---|---|---|---|
| 5,990,550 | A | * | 11/1999 | Umezawa .................. 257/712 |
| 6,072,122 | A | * | 6/2000 | Hosoya .................... 174/524 |
| 6,518,666 | B1 | | 2/2003 | Ikeda |
| 2002/0149098 | A1 | | 10/2002 | Seyama et al. |
| 2003/0047800 | A1 | | 3/2003 | Sasakura et al. |
| 2005/0202595 | A1 | | 9/2005 | Yonehara et al. |

FOREIGN PATENT DOCUMENTS

| JP | 08-274214 | 10/1996 |
|---|---|---|
| JP | 2002-314031 | 10/2002 |

OTHER PUBLICATIONS

Office Action mailed from the USPTO on Feb. 21, 2006 in U.S. Appl. No. 10/803,879.
Notice of Allowance issued Apr. 6, 2007 in corresponding U.S. Patent Application No. 10/803,879 (9 pp).

* cited by examiner

*Primary Examiner*—Howard Weiss
*Assistant Examiner*—(Vikki) Hoa B. Trinh
(74) *Attorney, Agent, or Firm*—Staas & Halsey LLP

(57) ABSTRACT

A packaging method, a packaging structure and a package is substrate capable of restraining a warp of a thin film substrate, increasing a product yield, and building up a sufficient cooling capacity in the case of mounting an LSI having a high exothermic quantity. A package substrate 1 of the invention is such that an opening 11 is formed in a first substrate 12, a thin film substrate (a second substrate) 13 is laminated on the first substrate 12, the opening 11 is covered with the thin film substrate 13. Next, a capacitor (a first electronic part) 14 is inserted into the opening 11 and bonded to the thin film substrate, a resin 15 fills an interior of the opening 11 to a fixed or larger thickness and is hardened, the thin film substrate 13 and the capacitor 14 are thereby sustained by the resin 15, an LSI 16 (a second electronic part) that should be connected to the capacitor 14 is bonded to a surface, on an exposed side, of the thin film substrate 13, and the capacitor 14 is connected to the LSI 16.

9 Claims, 21 Drawing Sheets

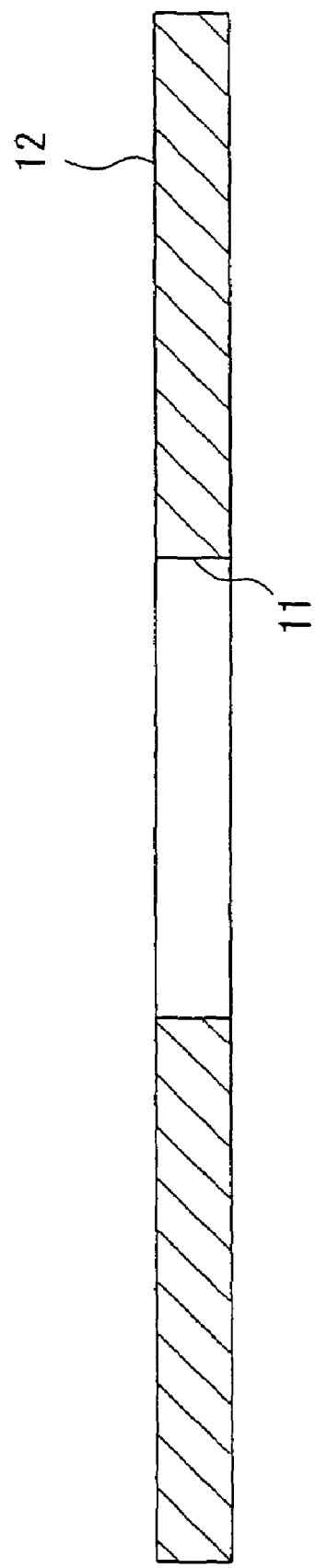
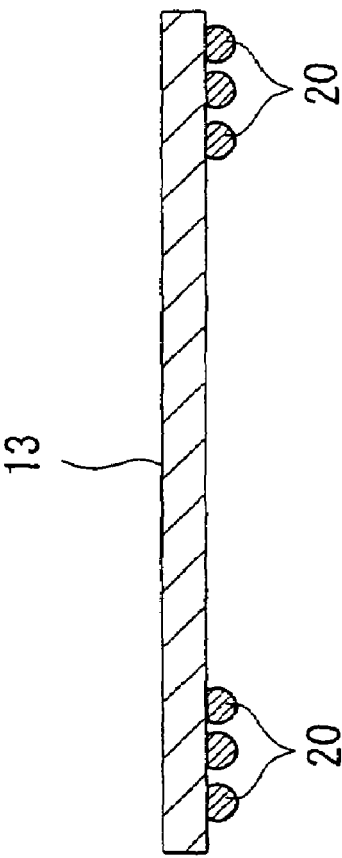
FIG. 2A
FIG. 2B

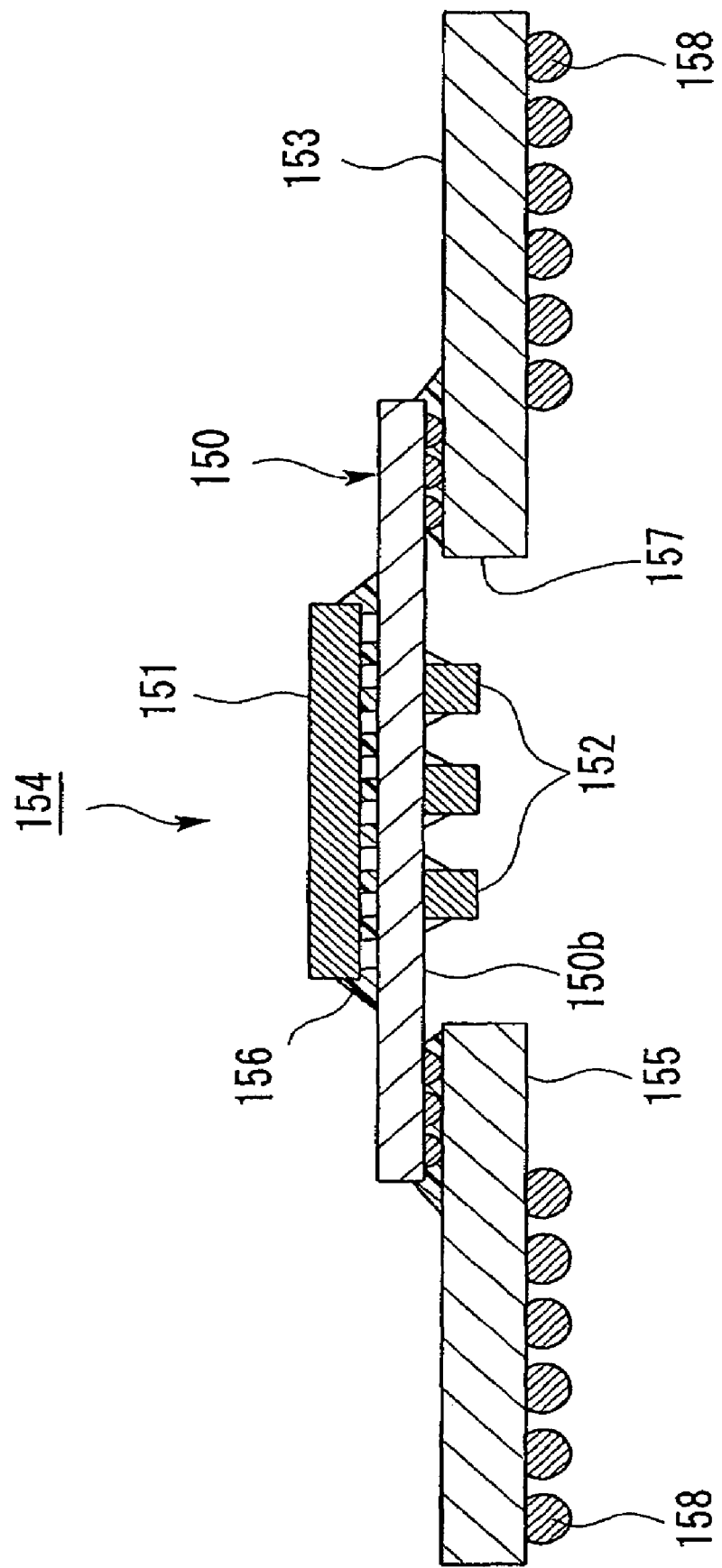

PACKAGING METHOD, PACKAGING STRUCTURE AND PACKAGE SUBSTRATE FOR ELECTRONIC PARTS

BACKGROUND OF THE INVENTION

The invention relates to a packaging method, a packaging structure and a package substrate for electronic parts, and particularly to a packaging method, a packaging structure and a package substrate for electronic parts including an LSI and a capacitor connected thereto.

There has hitherto been, as shown in FIG. 18, a package substrate 154, wherein an LSI (Large Scale Integrated circuit) 151 and a capacitor 152 are mounted on both surfaces of a thin film substrate 150, and this thin film substrate 150 is laminated on a parent board (board) 153 (refer to, e.g., Japanese Patent Application Laid-Open Publication No. 2002-314031).

The thin film substrate 150 is used for reducing an inductance between the LSI 151 and the capacitor 152 that are mounted on both sides of the substrate. Note that the thin film substrate generally indicates a substrate of which a thickness is equal to or smaller than 50 µm.

On the occasion of manufacturing this package substrate 154, to begin with, as shown in FIG. 19(a), wiring is formed on the thin film, and metal terminals 155 are formed by a plating process.

Next, as shown in FIG. 19(b), the LSI 151 is bonded by, for instance, a solder 159 to a surface 150a of the thin film substrate 150. Next, an underfill agent 156 fills between the LSI 151 and the thin film substrate 150.

Herein, the underfill agent 156 fills for relieving a stress at a bonding portion between the respective portions. Namely, a coefficient of thermal expansion of the thin film substrate 150 is different from that of the LSI 151, and hence there might be a possibility of causing a crack in the solder if leaving as it is.

Such being the case, the underfill agent 156 fills between the thin film substrate 150 and the LSI 151, and the stress due to the difference between the coefficients of thermal expansions is thereby relieved, thus preventing the occurrence of the crack in the solder.

Next, as shown in FIG. 19(c), the capacitor 152 is mounted on an undersurface 150b of the thin film substrate 150.

On the other hand, as shown in FIG. 20, the parent board 153 is formed with an opening 157 having a predetermined size and with solder balls 158.

Then, as shown in FIG. 18, the thin film substrate 150 mounted with the LSI 151 and the capacitor 152 is laminated on the parent board 153. The thin film substrate 150 is bonded through the solder balls 158 to the parent board 153.

At this time, the capacitor 152 mounted on the thin film substrate 150 is inserted into the opening 157 of the parent board 153.

Thus, with the conventional package substrate 154, the capacitor 152 mounted on the undersurface 150b of the thin film substrate 150 is inserted into the opening 157 of the parent board 153.

This package substrate 154 enables both an enhancement of a packaging density of the electronic parts and downsizing.

SUMMARY OF THE INVENTION

The conventional package substrate 154 is, however, hard to ensure fixed or higher flatness due to, as shown in FIG. 21, an occurrence of warp in a thin film substrate 150 because of a low rigidity of the thin film substrate 150.

On the other hand, terminals of the LSI 151 are extremely precisely formed. In the case of the thus precisely formed terminals to the thin film substrate 150, if the thin film substrate 150 has a warp d as in the prior art, it is difficult to completely connect all the terminals to the thin film substrate 150.

Hence, there arises a problem, wherein a product yield of the package substrate 154 is low and decreased on the order of several percents (%) as the case may be.

Further, in the case of mounting the LSI 151 having a high exothermic quantity, a large-sized cooling part having a sufficient cooling capacity such as a fin is required to be bonded to the LSI 151 in order to cool off the LSI 151.

However, this type of cooling part has a large weight, and hence, if this is mounted on the LSI 151 of the conventional package substrate 154, the warp d of the thin film substrate 150 further increases. It has therefore hitherto been difficult to build up the sufficient cooling capacity.

The invention was made in view of these problems and aims at providing a packaging method, a packaging structure and a package substrate capable of restraining a warp of a thin film substrate, this being done, increasing a product yield, and building up a sufficient cooling capacity in the case of mounting an electronic part having a high exothermic quantity.

The invention adopts the following means for solving the problems.

Namely, the invention is a packaging method characterized in that an opening is formed in a first substrate, a second substrate is laminated on the first substrate, the opening is covered with the second substrate, a first electronic part is inserted into the opening and bonded to the second substrate, a resin fills an interior of the opening to a fixed or larger thickness and is hardened, the first substrate and the first electronic part are thereby sustained by the resin, a second electronic part that should be connected to the first electronic part is bonded to a surface, on an exposed side, of the second substrate, and the first electronic part is connected to the second electronic part.

According to the method of the invention, after laminating the second substrate on the first substrate, the resin fills the opening of the first substrate before the second electronic part is mounted on the second substrate. Owing to this, the resin sustains the second substrate and the first electronic part, whereby the warp of the second substrate is restrained, and the fixed or higher flatness is ensured.

Thereafter, when mounting the second electronic part on the second substrate, the flatness of the second substrate is ensured, whereby all the terminals can be completely connected to the second substrate even in a case where the terminal of the second electronic part are precisely formed.

Further, the invention is a packaging structure characterized by comprising: a first substrate having an opening; a second substrate laminated on the first substrate and covering the opening; a first electronic part inserted into the opening and bonded to the second substrate, a hard resin filling an interior of the opening to a fixed or larger thickness; a second electronic part bonded to a surface, on an exposed side, of the second substrate; and wiring for connecting the first electronic part to the second electronic part.

According to the packaging structure of the invention, the hard resin fills the interior of the opening of the first substrate to the fixed or larger thickness and therefore sustains a weight of the second substrate mounted on the portion, facing the opening, of the second substrate and weight of the first and second electronic parts.

Accordingly, it is feasible to prevent the warp of and a damage to the second substrate even in the case where the weights of the first and second electronic parts are large.

Herein, a thin film of which a thickness is equal to or smaller than 50 µm can be exemplified as the second substrate. In this case, the warp of the thin film of which the wall thickness is extremely the thin can be restrained.

Moreover, a capacitor can be exemplified as the first electronic part, and an n LSI can be exemplified as the second electronic part. In this instance, even in a case where the LSI having large consumption of electric power is mounted on the thin film substrate and a cooling part having a large cooling capacity and a large weight is mounted in order to cool off this LSI, the warp of the thin film substrate can be restrained.

Moreover, the resin contains a filler agent. The filler agent contains silica ($SiO_2$).

Still further, a coefficient of thermal expansion (CTE) of the resin is adjusted according to the first and second substrates, and the first and second electronic parts. A Young's modulus of the resin can be also adjusted. The coefficient of thermal expansion and the Young's modulus can be adjusted by adjusting a quantity and a particle size of the silica contained in the filler agent.

The CTE of the resin is adjusted so as to absorb a difference between the coefficients of thermal expansions of the bonding portions of the respective portions. Moreover, after adjusting the CTE, the Young's modulus is adjusted to be as large as possible.

This leads to an improvement of the reliability of the bonding portions between the first substrate and the second substrate and between the first electronic part and the second electronic part.

The first substrate can include a sustaining member provided within the opening and sustaining an exposed surface of the resin. In this case, the resin and the sustaining member sustain the weight of the second substrate and the weights of the first and second electronic parts, thereby further improving the reliability.

Further, the sustaining member can be formed in a lattice-like shape or a cross shape. This enables to secure a space for mounting the first electronic part.

Moreover, a fin for cooling can be bonded to the second electronic part. In this case, even in a case where the cooling fin has a large cooling capacity and a large weight, the warp of the second substrate can be restrained.

Furthermore, the second substrate can be provided with a stiffener for reinforcement. In this case, even in a case where the second substrate is thin and is therefore low of its rigidity, the rigidity of the second substrate is raised by providing the stiffener. Accordingly the handleability of the second substrate is improved.

The stiffener may be provided on the side of the first electronic part. In this case, the stiffener can be formed in a lattice-like shape or a cross shape. In this case also, it is possible to secure a space for mounting the first electronic part.

Still further, the stiffener may be mounted on the side of the second electronic part. In this case, the stiffener can be disposed on an outer peripheral edge of the second substrate. A space for mounting the second electronic apart can be thereby secured inwardly of the stiffener.

Moreover, the resin may contain a material exhibiting a high thermal conductivity. Owing to this, the electronic part mounted on the second substrate can be cooled off through the resin from the side of the first substrate.

Ceramics or diamond can be exemplified as the high thermal conductivity material.

Further, the invention is suitable for a package substrate.

Note that the constituting elements components described above can be combined with one another as far as there is no deviation from the gist of the invention.

DESCRIPTION OF THE DRAWINGS

FIG. 2 is a sectional view showing a method of manufacturing the package substrate in the first embodiment according to the invention;

FIG. 18 is a sectional view showing a package substrate of the prior art.

DETAILED DESCRIPTION OF THE INVENTION

Embodiments of the invention will be described based on the accompanying drawings of FIG. 1 through 17.

FIRST EMBODIMENT

Figure 1:
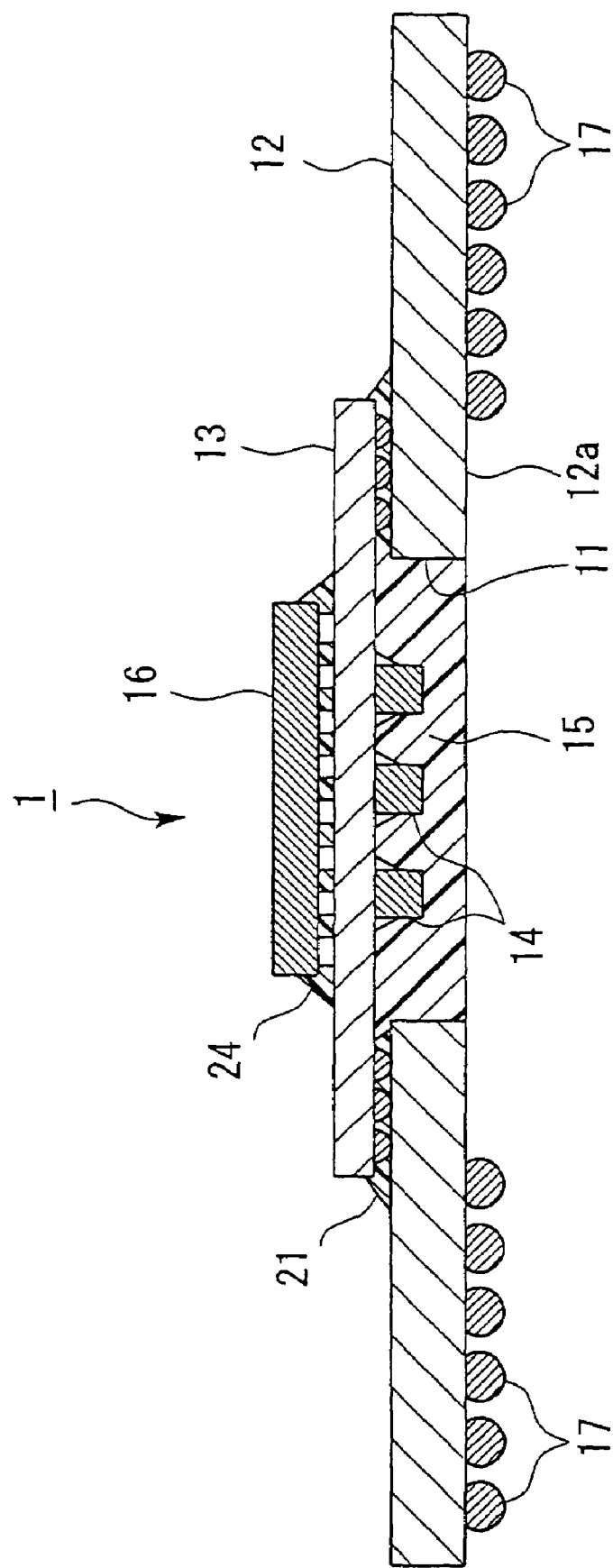
FIG. 1 is a sectional view showing a package substrate in a first embodiment according to the invention.

FIG. 1 is a diagram showing a package substrate 1 to which the invention is applied. This package substrate 1 includes a parent board (a first substrate) 12 having an opening 11, and a thin film substrate (a second substrate) 13 laminated on this parent board 12 in a state of covering the opening 11.

Further, this package substrate 1 includes a capacitor (a first electronic part) 14 bonded to the thin film substrate 13 and inserted into the opening 11, a hard resin 15 filling an interior of the opening 11, an LSI (Large Scale Integrated circuit, a second electronic part) 16 bonded on the surface, on the opposite side to the capacitor 14, of the thin film substrate 13, wiring (unillustrated) that connects the capacitor 14 to the LSI 16, and solder balls 17 provided on the parent board 12.

The parent board 12 may use a substrate of which a thickness is on the order of, e.g., 0.6 through 1.0 mm. Further, the thin film substrate 13 may use a substrate of which a thickness is equal to or smaller than, e.g., 50 μm.

The both surfaces of the thin film substrate 13 are, as described above, mounted with the LSI 16 and the capacitor 14 which eliminates power source noises supplied thereto, whereby inductance between the LSI 16 and the capacitor 14 can be reduced. It is therefore preferable that the thickness of the thin film substrate 13 be thin as much as possible.

Next, a method of manufacturing this package substrate 1 will be explained. On the occasion of manufacturing the package substrate 1, to begin with, as shown in FIG. 2(a), the opening 11 having a predetermined size is formed in the parent board 12.

Further, as illustrated in FIG. 2(b), the thin film substrate 13 is formed with metal terminals 20 by a plating process and the wiring (not shown). The metal terminals 20 on the thin film substrate 13 are formed for electrically connecting to the parent board 12.

Figure 3:
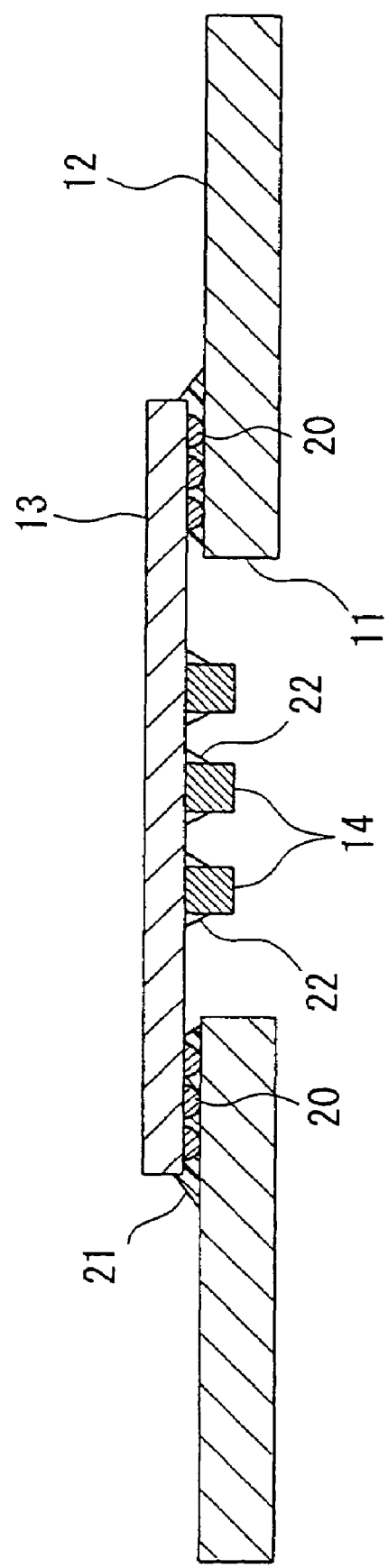
FIG. 3 is a sectional view showing a method of manufacturing the package substrate in the first embodiment according to the invention.

Next, as shown in FIG. 3, the thin film substrate 13 is laminated on the parent board 12 in the state of covering the opening 11 of the parent board 12. Then, the thin film substrate 13 is bonded via a solder or an underfill agent such a bonding agent 21 to the parent board 12. The thin film substrate 13 can be also bonded to the parent board 12 by an anisotropic conductive bonding agent as a substitute for the solder or the underfill agent such as the bonding agent 21.

Next, the capacitor 14 is inserted into the opening 11 of the parent board 12. Then, the capacitor 14 is bonded through a solder 22 to the thin film substrate 13 exposed within the opening 11.

Figure 4:
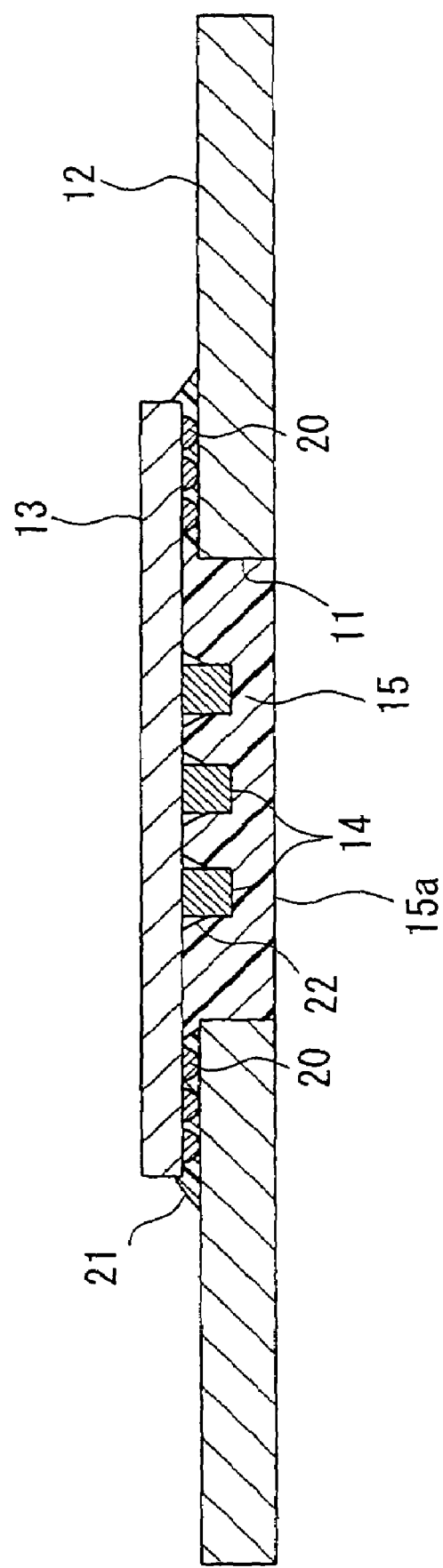
FIG. 4 is a sectional view showing a method of manufacturing the package substrate in the first embodiment according to the invention.

Next, as illustrated in FIG. 4, the hard resin 15 fills the interior of the opening 11 of the parent board 12. The interior of the opening 11 is filled with the resin 15 to a fixed or larger thickness. In this embodiment, the resin 15 fills so as to be embedded in the whole opening 11.

Note that the thickness of the resin 15 is a thickness capable of sustaining a weight of the thin film substrate 13 and weights of the electronic parts mounted on this film substrate 13 and capable of restraining a warp of the film substrate 13 down to a fixed or lower degree.

Further, a surface 15a of the resin 15 is formed flat. Then, this resin 15 is hardened. This resin 15 can be exemplified as what mixes an epoxy resin with a filler agent that will be described later on.

Moreover, this resin 15 has, on the occasion of bonding the parent board 12 to a mother board (not shown), a purpose of preventing an occurrence of a crack in a bonding portion between the respective portions due to a difference in coefficients of thermal expansion between the parent board 12 and the mother board.

Therefore, herein, as will next be explained, a coefficient of thermal expansion (CTE) after being hardened and a Young's modulus are adjusted by a known method.

Namely, the CTE and the Young's modulus can be adjusted by mixing the resin 15 with the filler agent. This filler agent contains silica ($SiO_2$).

The CTE of the resin 15 is adjusted by adjusting a mixing quantity and a particle size of the silica mixed into the filler agent. Generally, the mother board and the parent board 12 are composed of an epoxy resin, and a coefficient of thermal expansion thereof is on the order of 17 ppm/° C. In this case, it is preferable that the CTE of the resin 15 be adjusted to 3 through 20 ppm/° C.

Thus, at first the CTE of the resin 15 is adjusted. Thereafter, in a state of retaining the adjusted CTE, the Young's modulus is adjusted. The Young's modulus is adjusted to as large as possible.

Note that the CTE and the Young' modulus of the resin 15 are properly adjusted according to materials and sizes of the respective parts constituting the package substrate 1.

Further, the filler agent is mixed also into the mother board and the parent board 12. Then, the CTEs and the Young's moduli of the mother board and the parent board 12 can be adjusted also by adjusting the mixing quantity and the particle size of the filler agent mixed into the mother board and the parent board 12.

Figure 5:
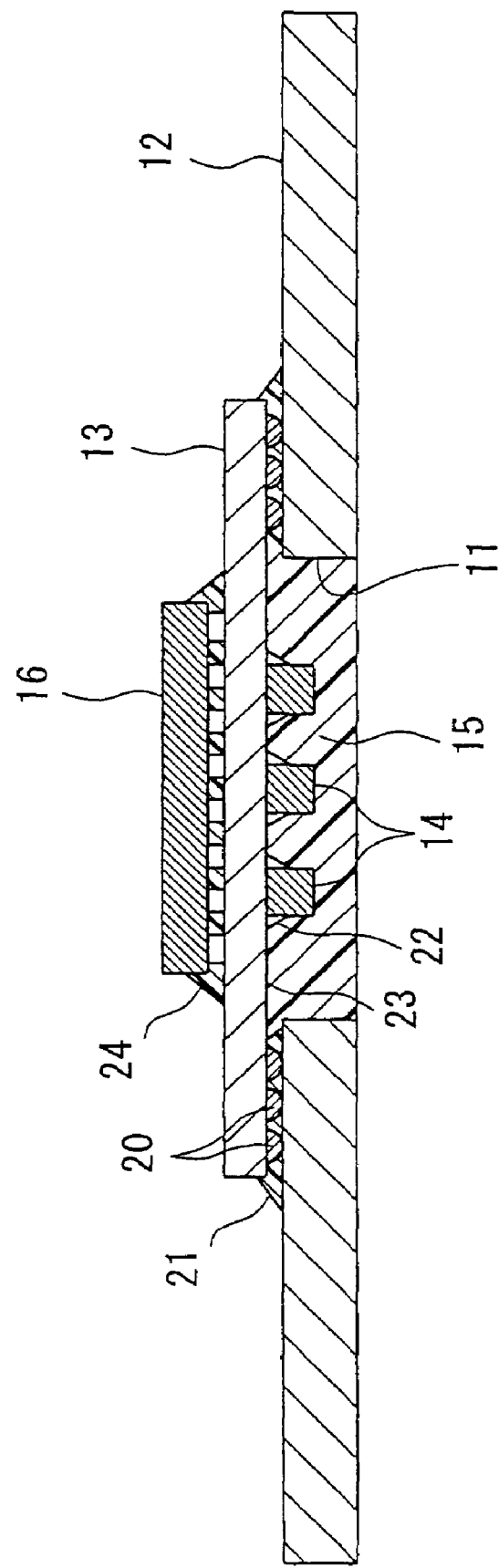
FIG. 5 is a sectional view showing a method of manufacturing the package substrate in the first embodiment according to the invention.

Next, as shown in FIG. 5, the LSI 16 is bonded through a solder 23 to the exposed surface of the thin film substrate 13, i.e., the surface on the opposite side to the surface mounted with the capacitor 14.

Next, an underfill agent 24 fills between the LSI 16 and the thin film substrate 13. Subsequently, as illustrated in FIG. 1, solder balls 17 are formed on a bottom surface 12a of the parent board 12.

Figure 6:
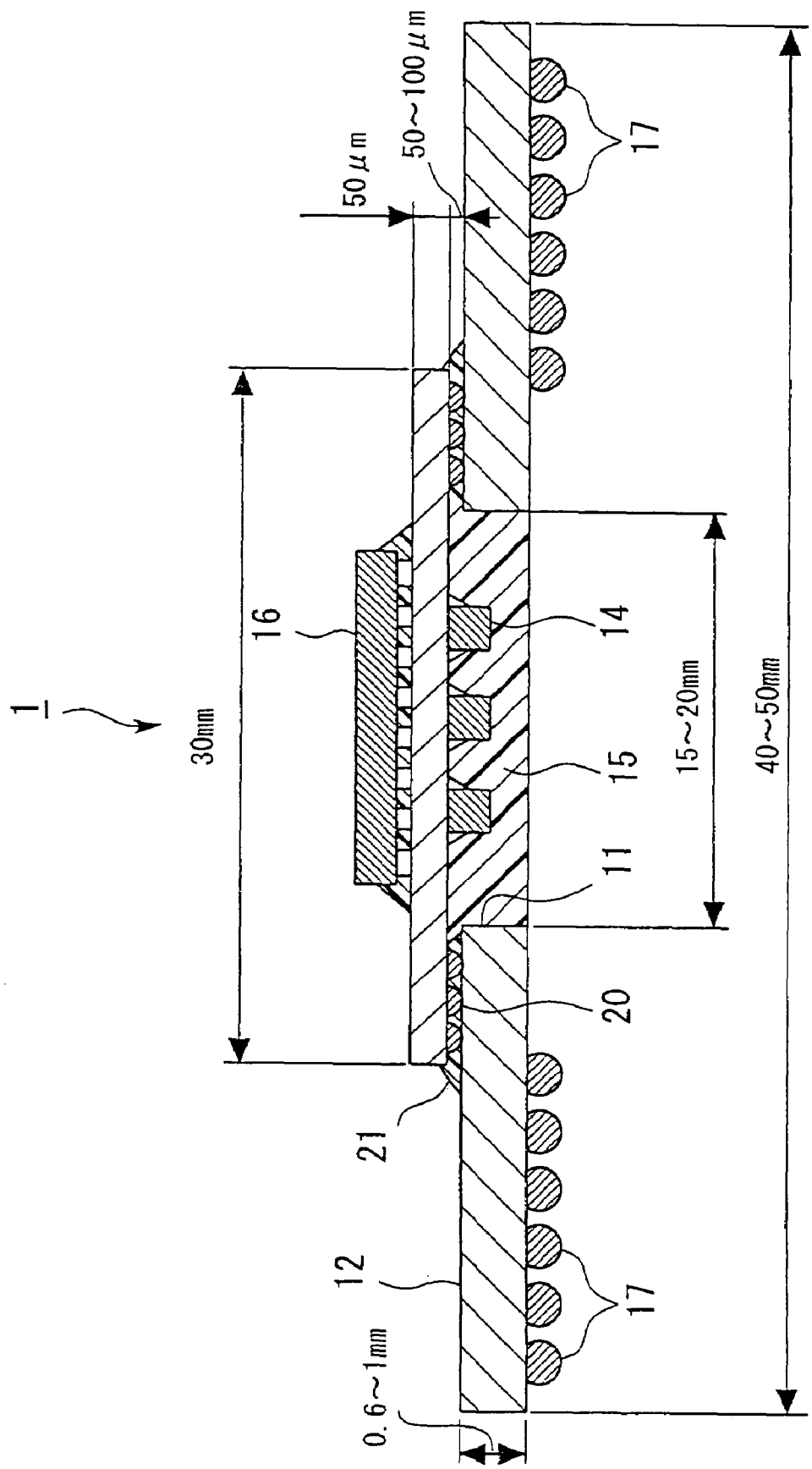
FIG. 6 is a sectional view showing dimensions of respective portions in the first embodiment according to the invention.

FIG. 6 exemplifies dimensions of the respective parts of the package substrate 1. In this embodiment, the parent board 12 is formed substantially in a square shape, wherein one side thereof is 40-50 mm. Further, the parent board 12 is 0.6 through 1.0 mm in thickness. The opening 11 of the parent board 12 is formed also substantially in the square shape, wherein one side thereof is 15-20 mm.

The thin film substrate 13 is formed substantially in the square shape, wherein one side thereof is on the order of 30 mm. The thin film substrate 13 is approximately 50 μm thick. The solder ball 17 formed on the lower surface of the thin film substrate 13 has a height of 50-100 μm.

Thus, the thin film package substrate 1 of the invention is such that after the thin film substrate 13 has been laminated on the parent board 12, the hard resin 15, before the LSI 16 is mounted on the thin film substrate 13, fills the interior of the opening 11 of the parent board 12 to the fixed or larger thickness.

Owing to this, the thin film substrate 13 and the capacitor 14 are sustained by the resin 15, and hence the thin film substrate 13 is restrained from being warped.

Figure 21:
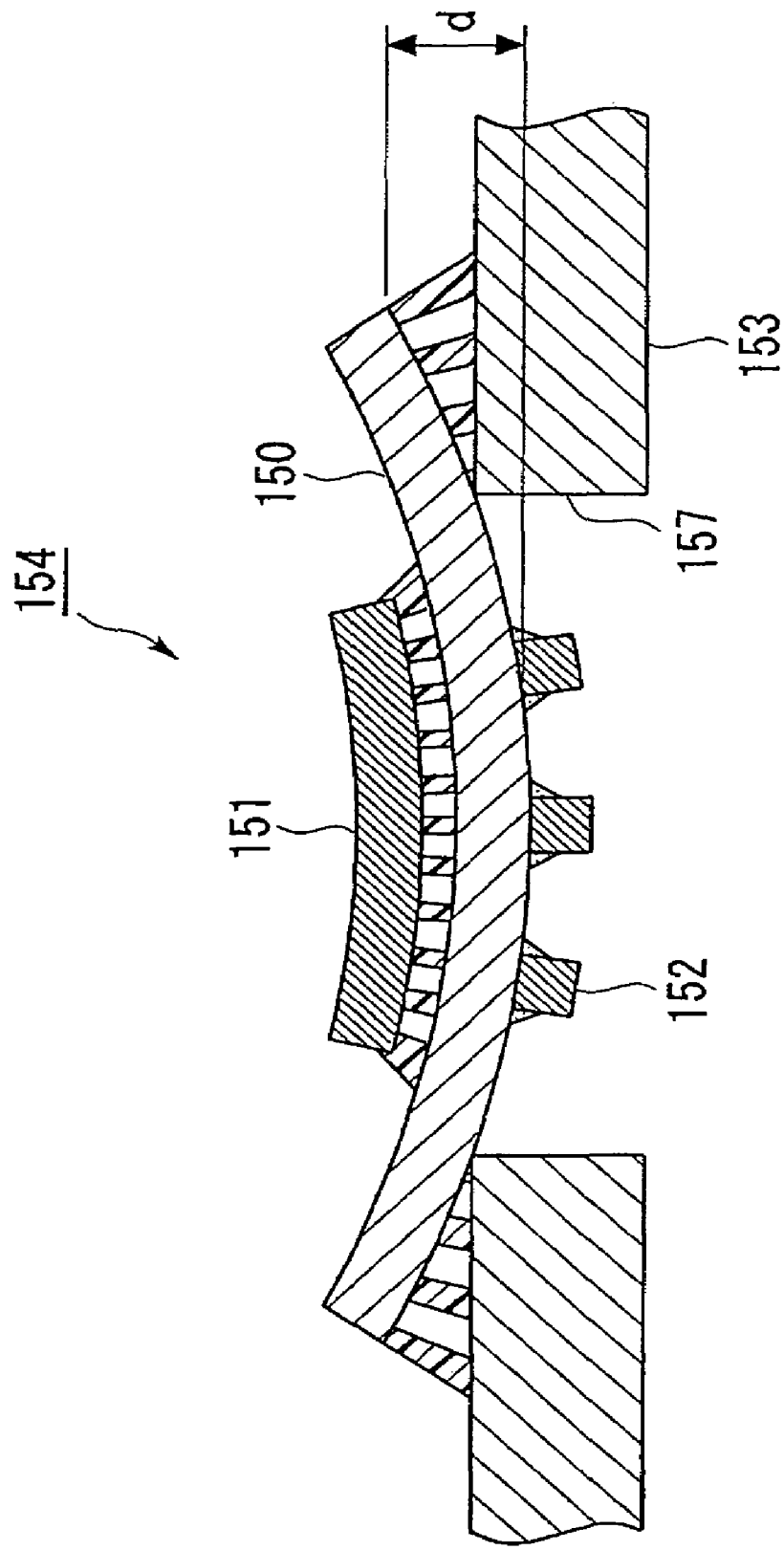
FIG. 21 is a sectional view showing a warp of the thin film on the package substrate of the prior art.

Then, when the LSI 16 is mounted on the thin film substrate 13, a fixed or higher level of flatness of the thin film substrate 13 is ensured. In this embodiment, a warp d (see FIG. 21) of the thin film is set equal to or smaller than approximately 35 µm.

This achieves a perfect connection of the precise terminal formed on the LSI 16 to the wiring of the thin film substrate 13 when the LSI 16 is mounted on the thin film substrate 13. It is therefore feasible to largely improve a product yield of the package substrate 1.

Further, the resin 15 sustains the weights of the LSI 16 and of the capacitor 14 that are mounted on the thin film substrate 13. Moreover, the CTE and the Young's modulus of the resin 15 are adjusted, and the stress at each bonding portion of the package substrate 1 is relieved. Accordingly, a reliability of the package substrate 1 is improved, and its life-time is prolonged.

Moreover, in this package substrate 1, the thin film substrate 13 is sustained by the resin 15, thereby the warp of the thin film substrate 13 can be restrained even when the large-size LSI 16 is mounted as compared with the prior art. Accordingly, the package substrate 1 can be upsized.

SECOND EMBODIMENT

Figure 7:
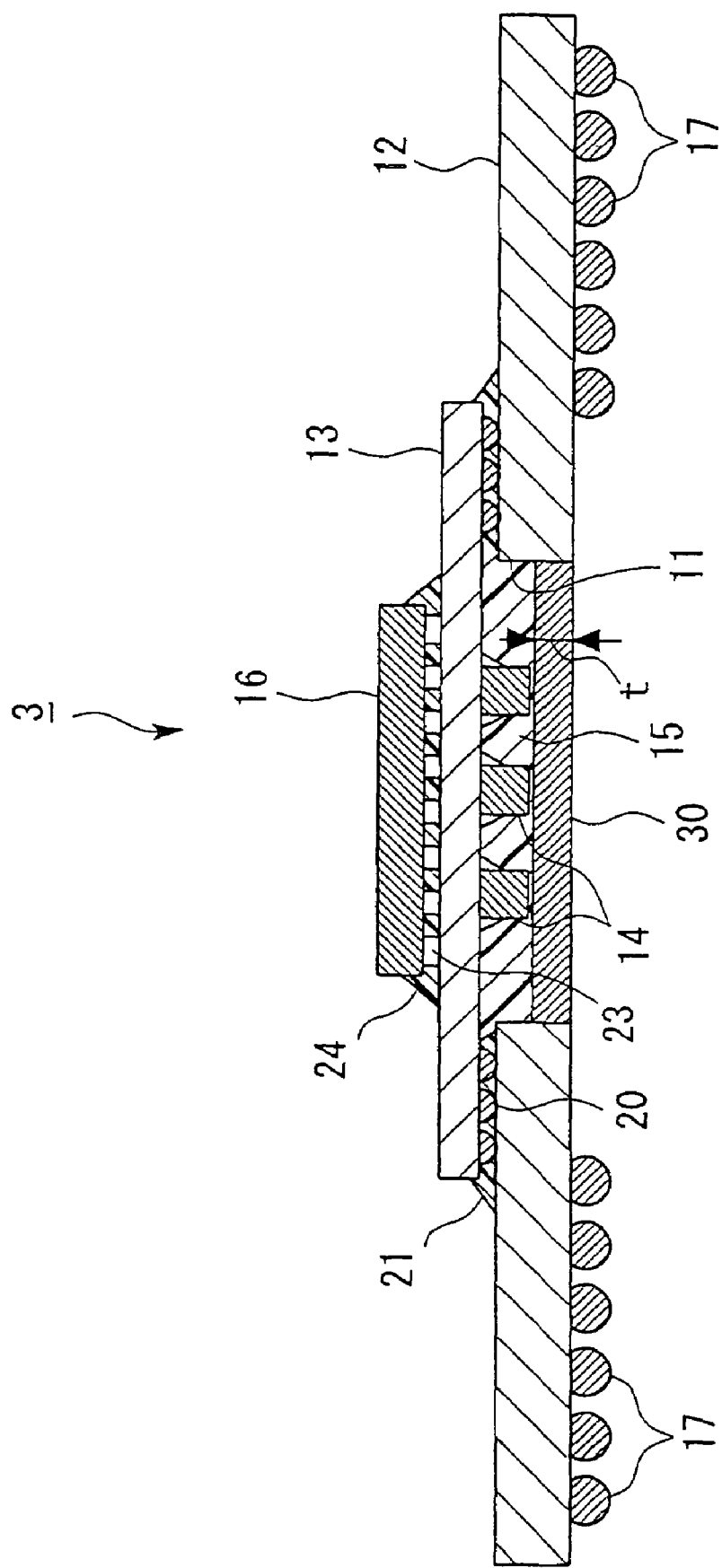
FIG. 7 is a sectional view showing a package substrate in a second embodiment according to the invention.

FIG. 7 illustrates a package substrate 3 in a second embodiment according to the invention. In this package substrate 3, as in the package substrate 1 in FIG. 1, the resin 15 fills the interior of the opening 11 of the parent board 12.

In this package substrate 3, however, a sustaining member 30 sustaining the resin 15 is bonded to an exposed surface (a lower side in FIG. 7) of the resin 15. The portions other than this are the same as those of the package substrate 1 in FIG. 1, and hence their detailed explanations are omitted.

The sustaining member 30 is formed of a metal or a carbon fiber in a plate-like shape having a predetermined thickness t. A size of the sustaining member 30 is the same as the size of the opening 11. This sustaining member 30 is inserted into the opening 11 and bonded to an inner peripheral surface of the opening 11 by the solder or the bonding agent.

On the occasion of manufacturing this package substrate 3, as the package substrate 1 in the first embodiment is manufactured, to start with, the opening 11 is formed in the parent board 12 (see FIG. 2(a)). Further, the metal terminals 20 are formed on the thin film substrate 13 (see FIG. 2(b)).

Figure 8:
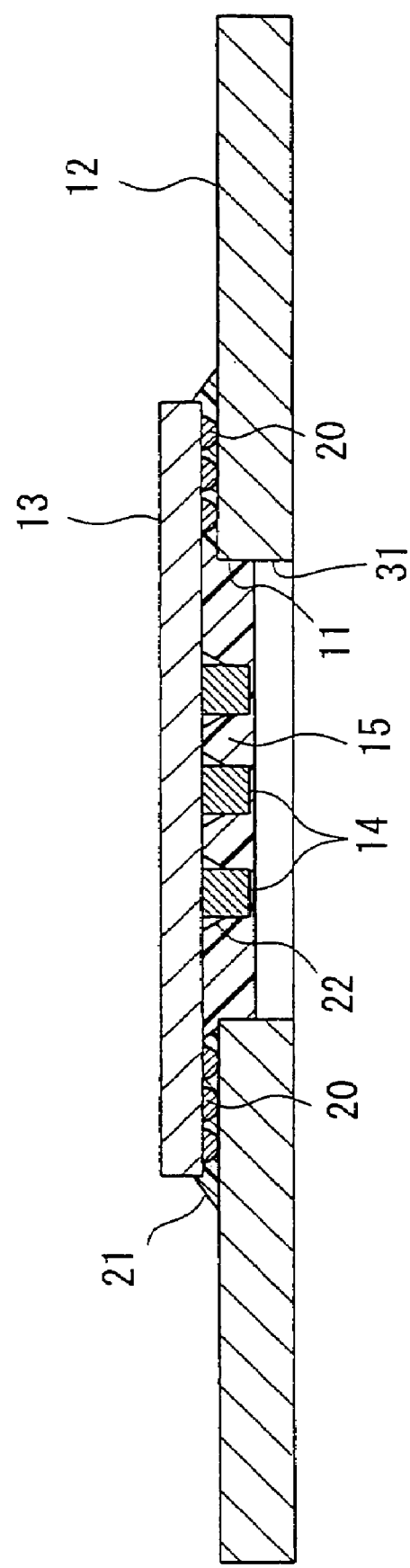
FIG. 8 is a sectional view showing a method of manufacturing the package substrate in the second embodiment according to the invention.

Next, the thin film substrate 13 is laminated on and bonded to the parent board 12 (see FIG. 3). Subsequently, as shown in FIG. 8, the resin 15 fills the interior of the opening 11 to a fixed or larger thickness and is then hardened.

In this package substrate 3, however, unlike the package substrate 1, when the interior of the opening 11 is filled with the resin 15, a space 31 into which to insert the sustaining member 30 is left within the opening 11.

Figure 9:
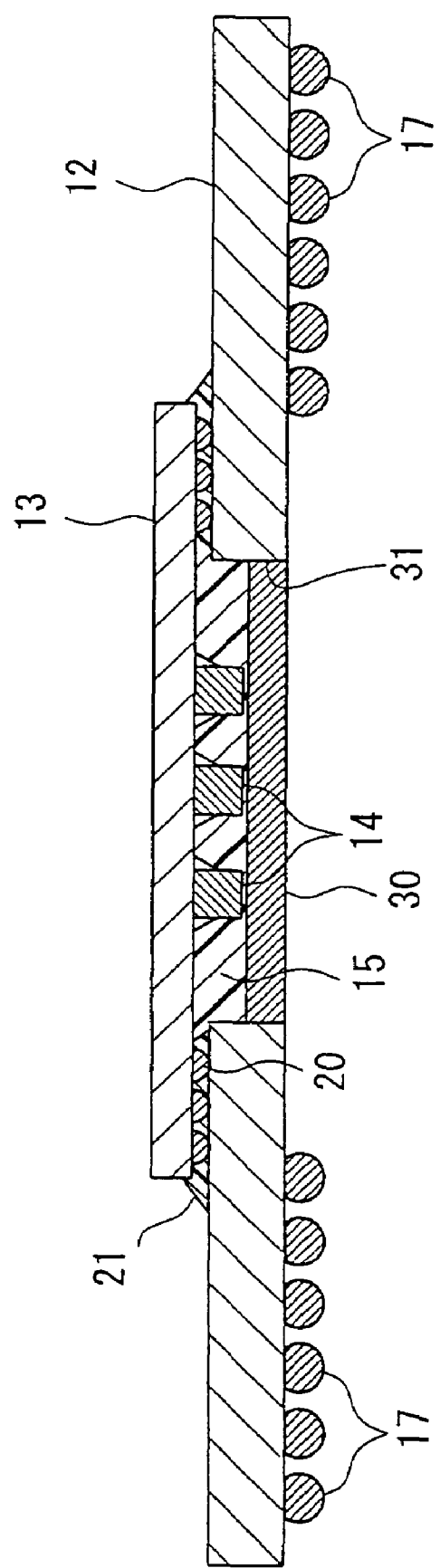
FIG. 9 is a sectional view showing a method of manufacturing the package substrate in the second embodiment according to the invention.

Then, as illustrated in FIG. 9, the sustaining member 30 is inserted into the space 31 within the opening 11 and bonded by the solder or the bonding agent. At this time, the sustaining member 30 is made to abut on the entire surface of the resin 15. The whole of the resin 15 is thereby sustained by the sustaining member 30.

Next, the solder balls 17 are formed on the parent board 12. Thereafter, as shown in FIG. 6, the LSI 16 is mounted on the thin film substrate 13.

This package substrate 3 is such that the resin 15 and the sustaining member 30 sustain the weights of the thin film substrate 13, the capacitor 14 and the LSI 16.

Accordingly, a larger-sized LSI 16 can be mounted. Further, the product yield of the package substrate 1 can be improved, and the package substrate 3 can be upsized.

THIRD EMBODIMENT

Figure 10:
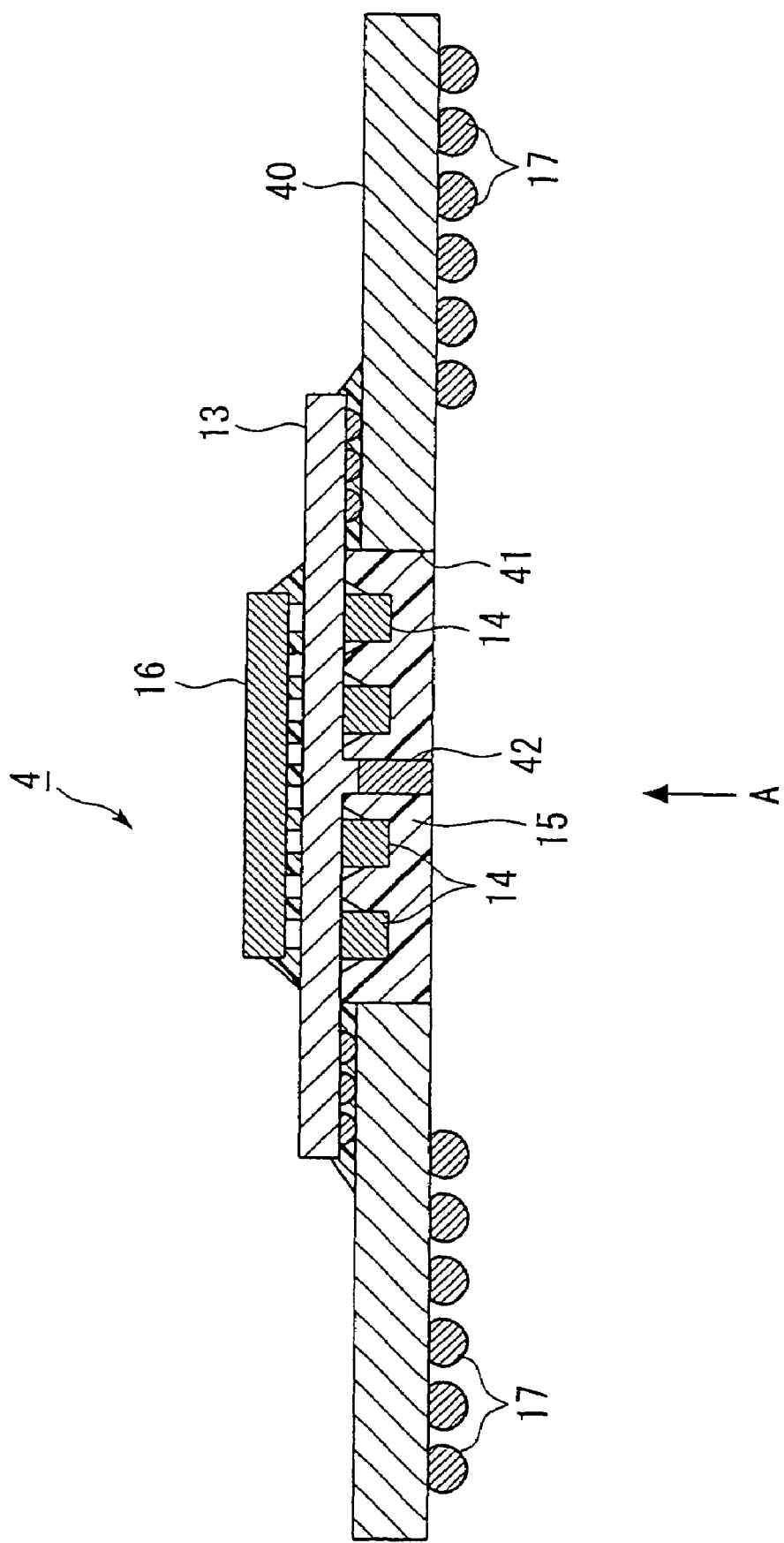
FIG. 10 is a sectional view showing a package substrate in a third embodiment according to the invention.

FIG. 10 shows a package substrate 4 in a third embodiment according to the invention. In this package substrate 4, a beam member 42 for reinforcement is formed inwardly of an opening 41 of a parent board 40. What is other than this is the same as the package substrate 1 (see FIG. 1) in the first embodiment, and therefore the detailed explanation thereof is omitted.

Figure 11:
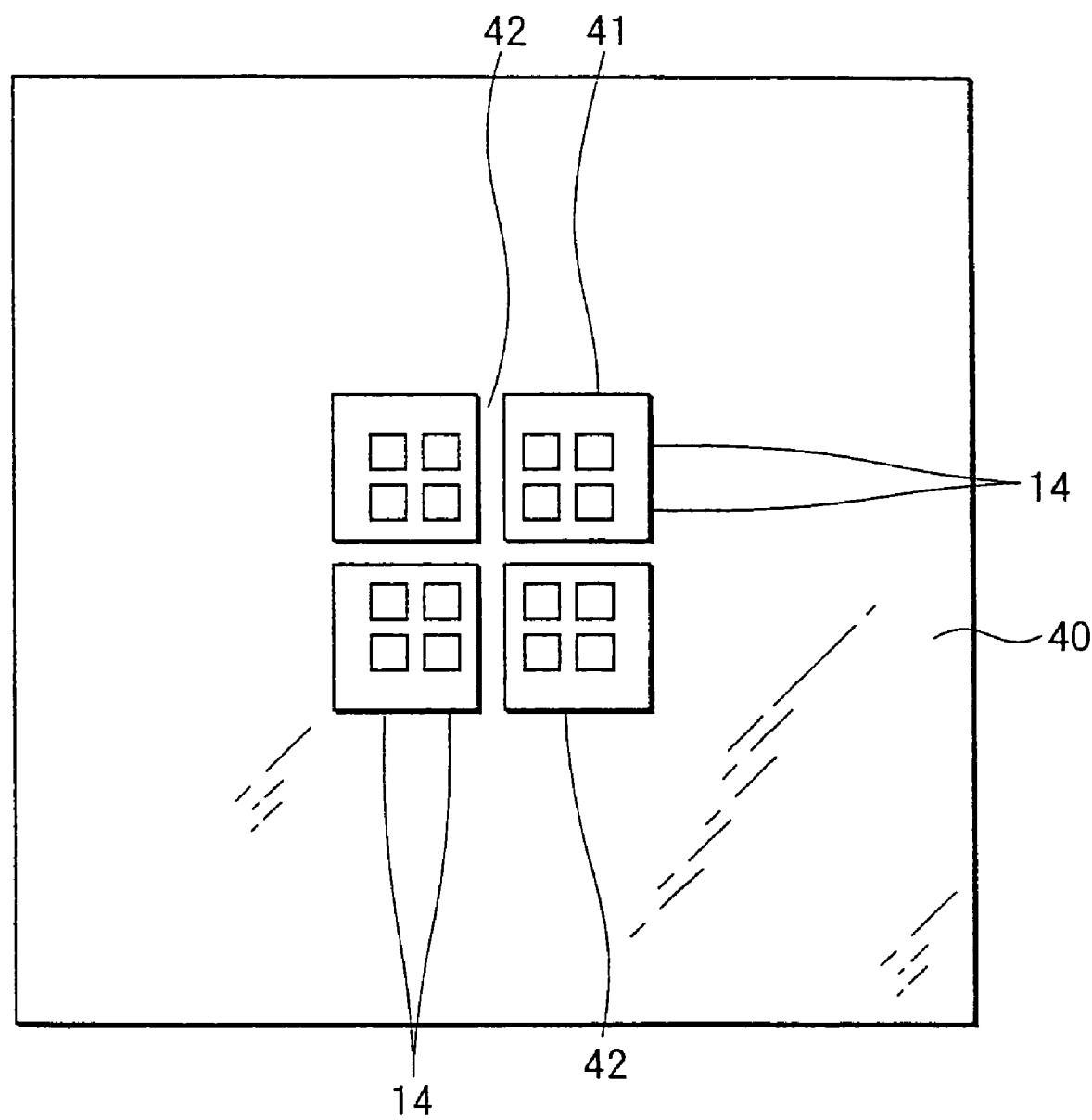
FIG. 11 is a view taken along the arrowhead line A in FIG. 10.

The beam member 42 is formed, as illustrated in FIG. 11, by leaving in a lattice-like shape some portions when forming the opening 41 in the parent board 40. In the embodiment, the beam member 42 is configured in a cross-like shape.

Spaces partitioned by the beam members 42 receive the insertions of the capacitors 14 and filled with the resin 15.

In this package substrate 4, the thin film substrate 13 is sustained by the resin 15 and the beam member 42. The warp of the thin film substrate 13 can be thereby restrained even in the case where the electronic parts having a large weight are mounted on the thin film substrate 13.

Figure 12:
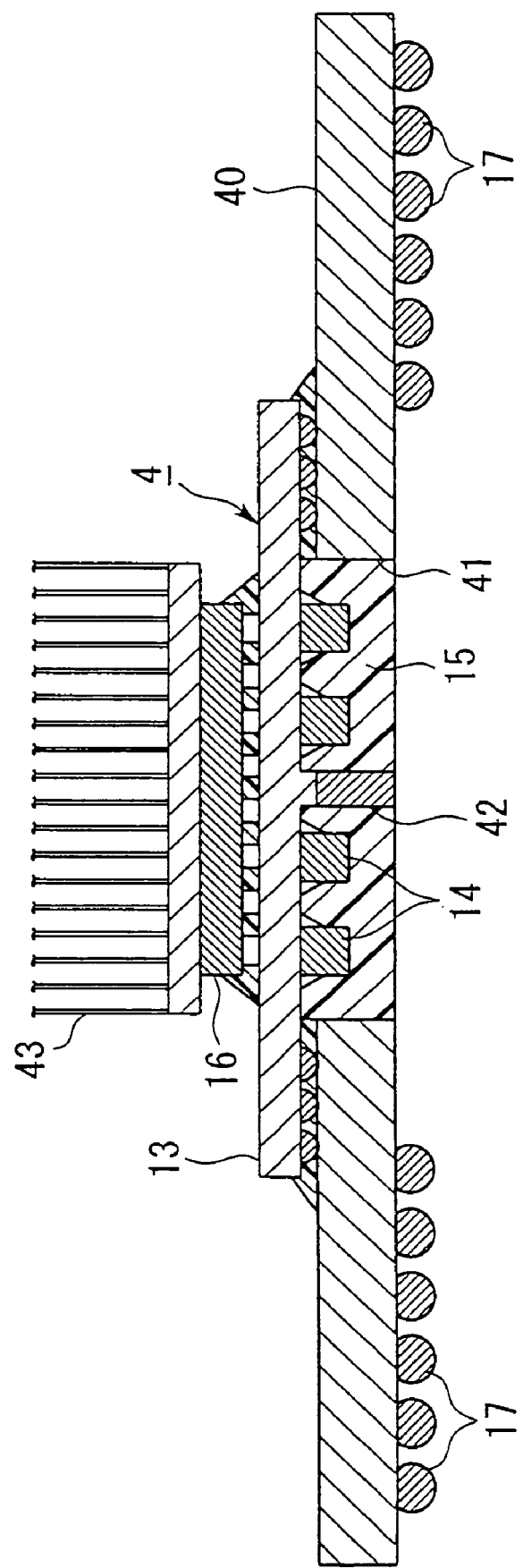
FIG. 12 is a sectional view showing a state where a fin is bonded to the package substrate in the third embodiment according to the invention.

Accordingly, this package substrate 4 is suited to a case where, for example, as illustrated in FIG. 12, the highly exothermic LSI 16 is mounted on the thin film substrate 13, and a large-sized fin 43 is bonded by pressure to this LSI 16.

FOURTH EMBODIMENT

Figure 13:
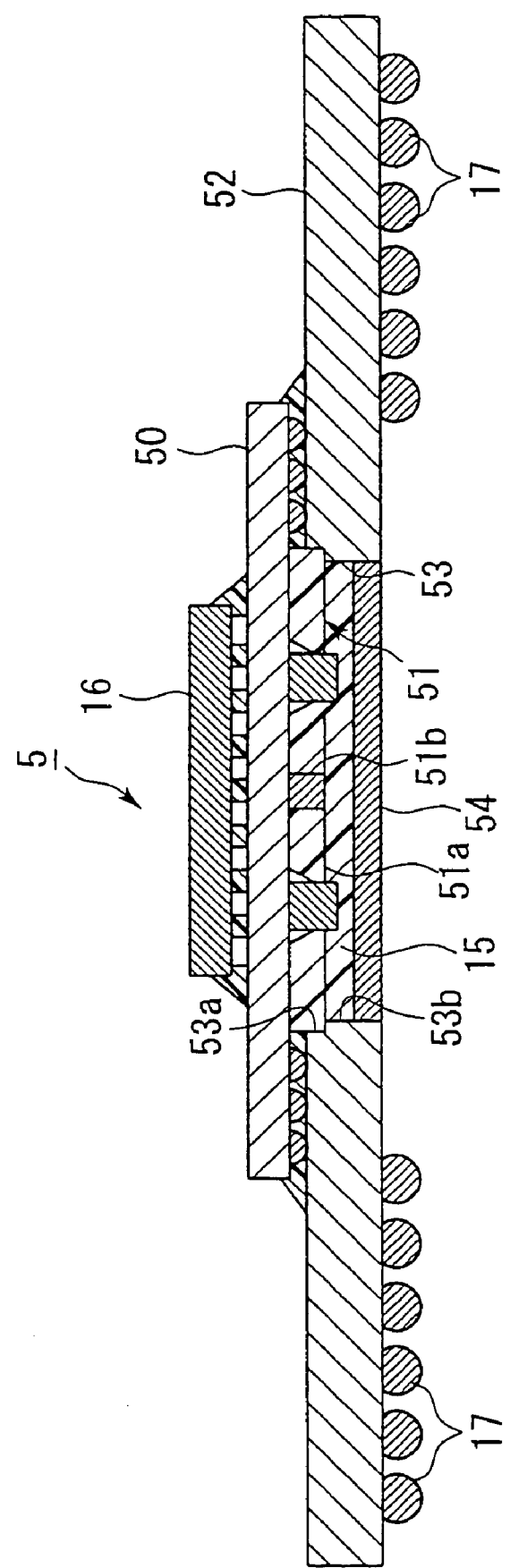
FIG. 13 is a sectional view showing a package substrate in a fourth embodiment according to the invention.

FIG. 13 illustrates a package substrate 5 in a fourth embodiment according to the invention. In this package substrate 5, a stiffener 51 for reinforcement, which is composed of, e.g., a stainless steel, is provided on a thin film substrate 50.

Further, a parent board 52 is formed with a stepped opening 53. This opening 53 includes a large-diameter opening portion 53a formed on a laminated side of the thin film substrate 50, and a smaller-diameter opening portion 53b than the opening portion 53a.

Moreover, a plate-like sustaining member 54 is inserted into and bonded to the small-diameter opening portion 53b of the opening 53.

Portions other than this are the same as those of the package substrate 1 (see FIG. 1) in the first embodiment, and hence their detailed explanations are omitted.

The stiffener 51 is bonded by the bonding agent, etc. to the surface, mounted with the capacitor 14, of the thin film substrate 50.

Figure 14:
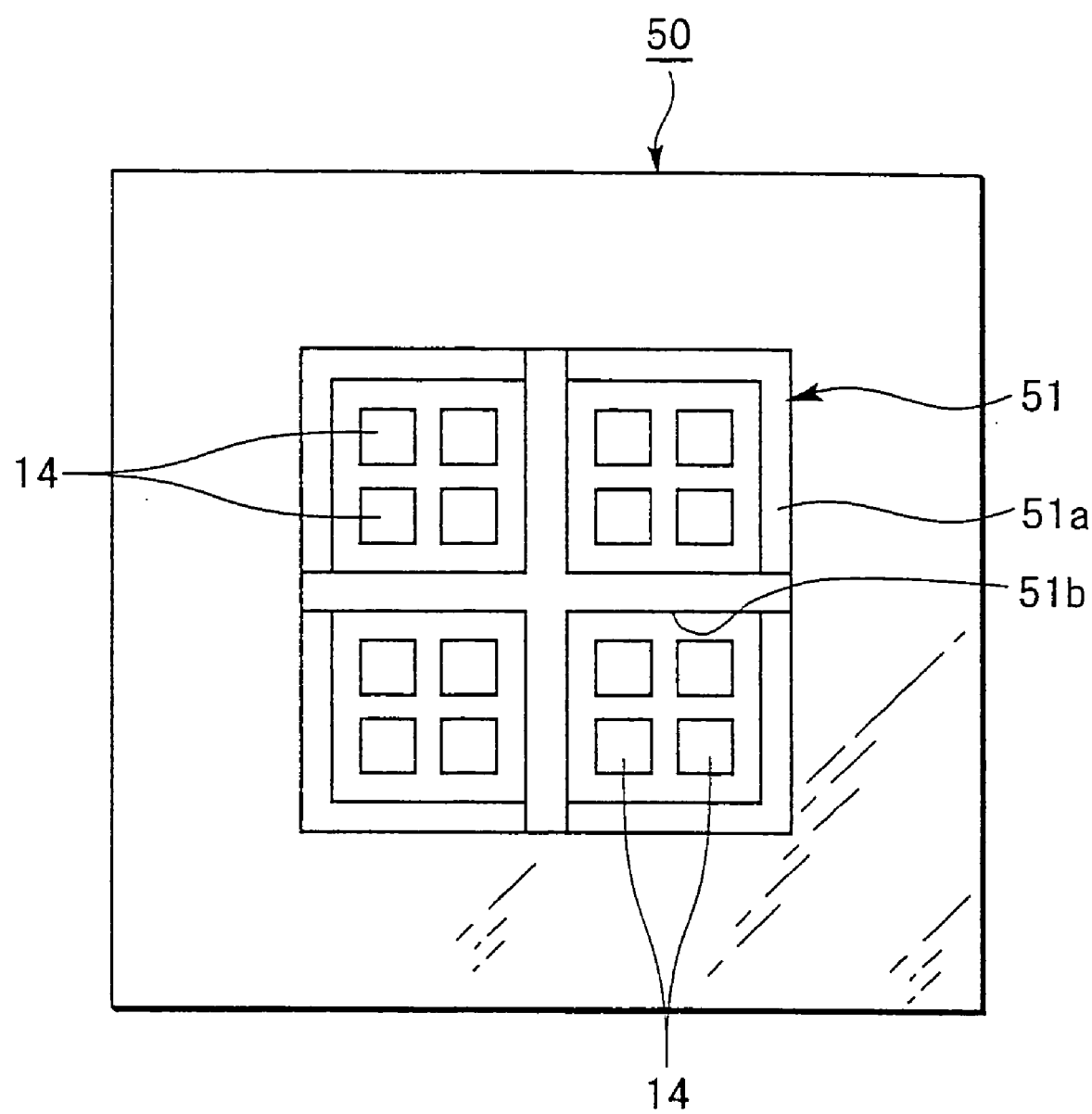
FIG. 14 is a sectional view showing a stiffener of the package substrate in the fourth embodiment according to the invention.

Further, this stiffener 51 includes, as shown in FIG. 14, a frame portion 51a having substantially the same size as the large-diameter opening portion 53a of the parent board 52, and a cross-shaped support portion 51b formed inwardly of this frame portion 51a.

Then, the frame portion 51a of stiffener 51 is inserted into the large-diameter opening portion 53a of the opening 53. This stiffener 51 is bonded to the thin film substrate 50 before laminating the thin film substrate 50 on the parent board 52.

This package substrate 5 has, because of the stiffener 51 increasing a rigidity of the thin film substrate 50, an extremely good handleability of the thin film substrate.

FIFTH EMBODIMENT

Figure 15:
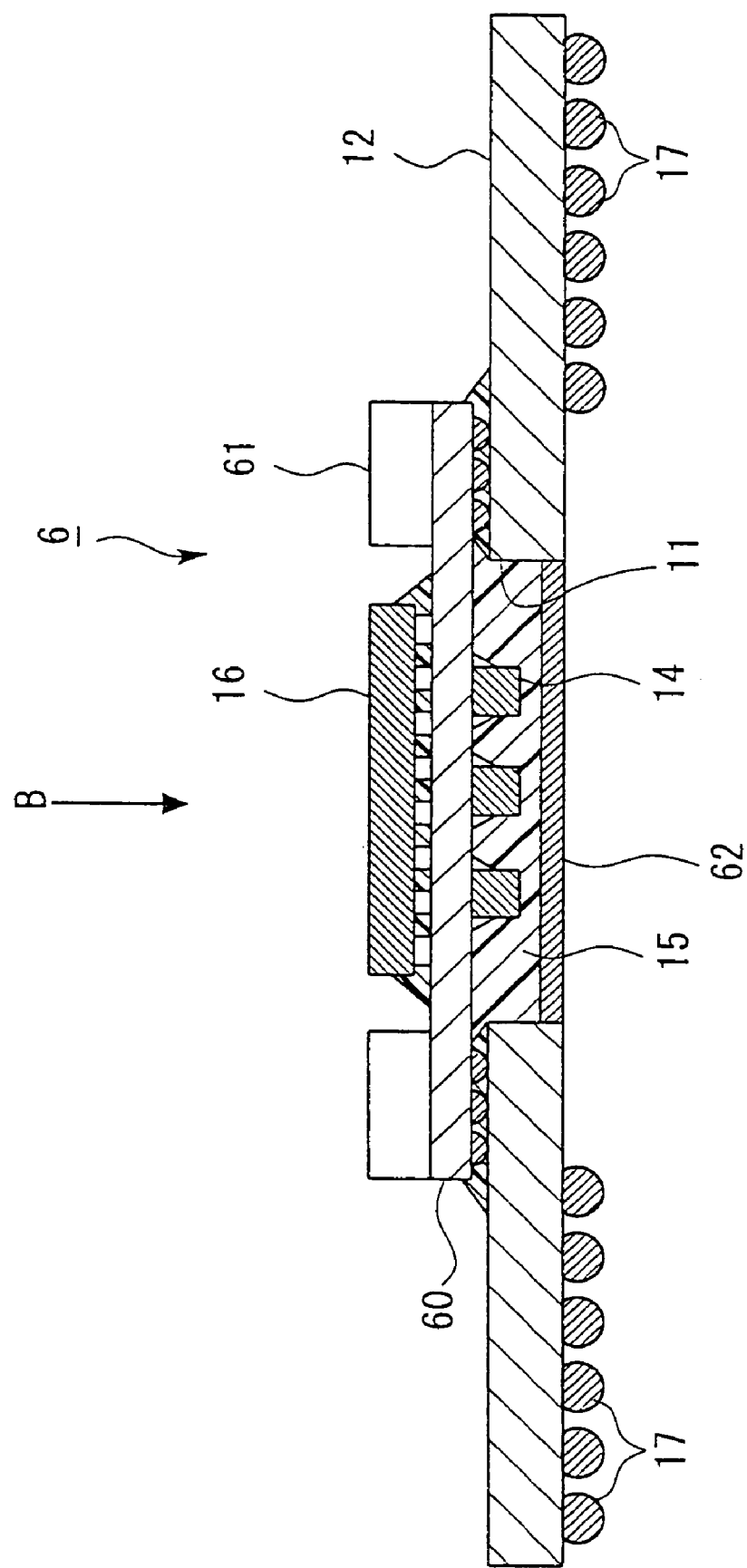
FIG. 15 is a sectional view showing a package substrate in a fifth embodiment according to the invention.

FIG. 15 shows a package substrate 6 in a fifth embodiment according to the invention. In this package substrate 6, a stiffener 61 composed of, e.g., a stainless steel is bonded to the surface, mounted with the LSI 16, of a thin film substrate 60. Further, the opening 11 of the parent board 12 is provided with a plate-like sustaining member 62.

What is other than this is the same as the package substrate 1 (see FIG. 1) in the first embodiment, and hence a detailed explanation thereof is omitted.

Figure 16:
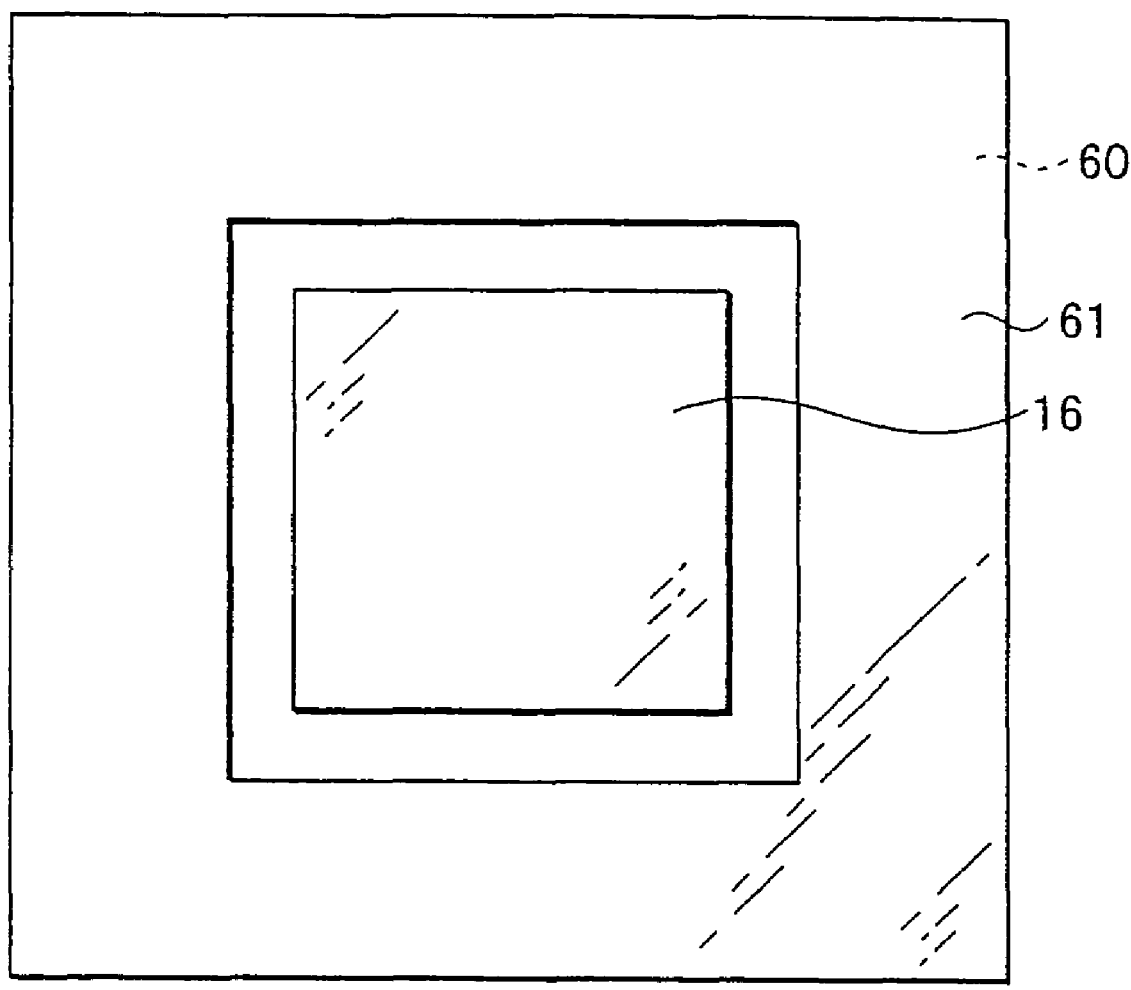
FIG. 16 is a view taken along the arrowhead line B in FIG. 15.

The stiffener 61 is, as illustrated in FIG. 16, formed in a square frame-like shape having substantially the same size as the thin film substrate 60. This stiffener 61 is disposed to encompass the LSI 16.

In this package substrate 6, the stiffener 61 is fixed extending along the entire periphery of the thin film substrate 60. Therefore, the stiffener 61 is fixed in a state of flattening the thin film substrate 60, thereby making it possible to restrain the warp of the thin film substrate 60 and to ensure the flatness thereof to a fixed or higher degree.

Accordingly, all the terminals can be perfectly connected to the thin film substrate 60, and therefore the product yield is improved.

SIXTH EMBODIMENT

Figure 17:
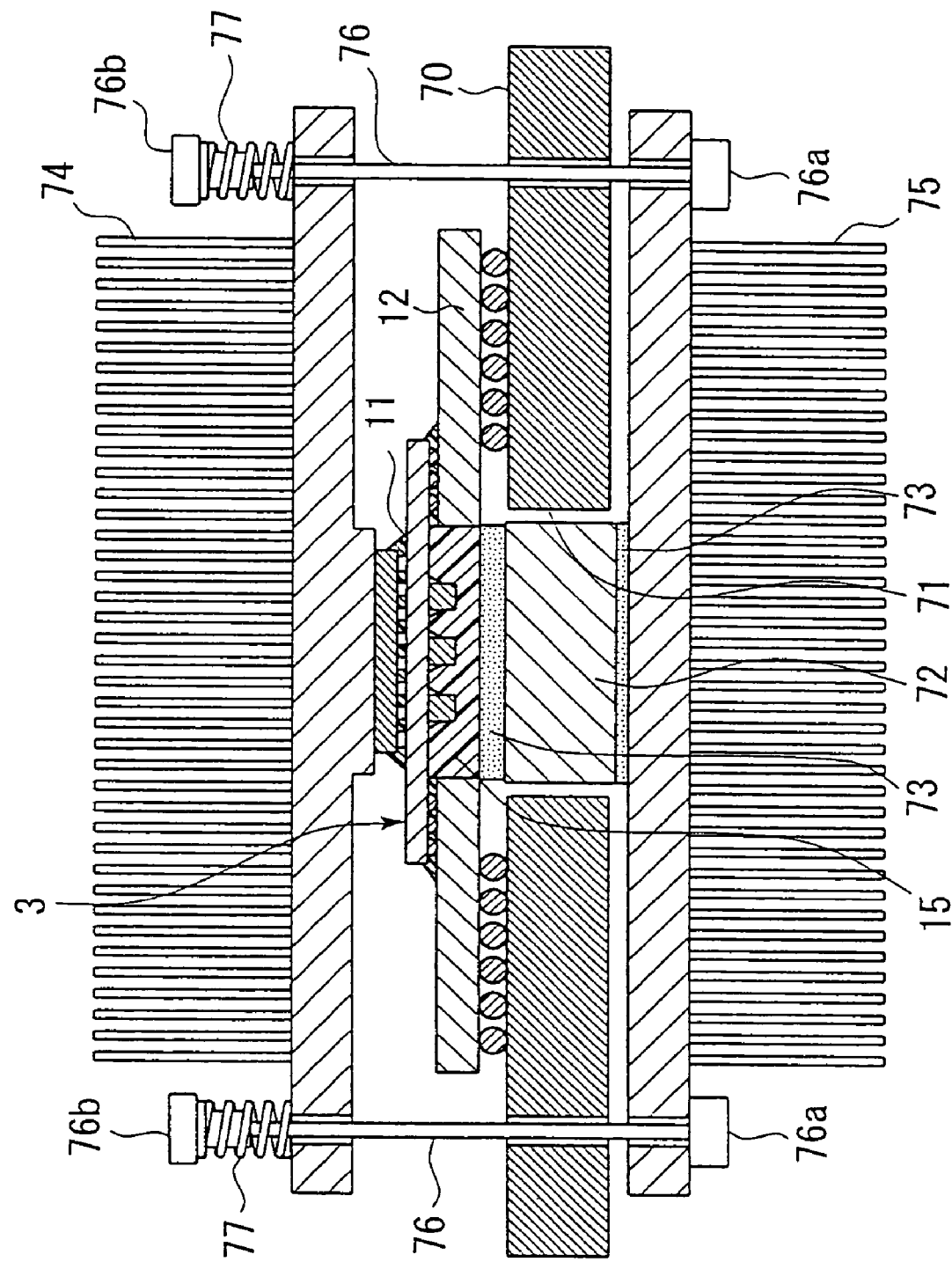
FIG. 17 is a sectional view showing a state where a package substrate in a sixth embodiment according to the invention is bonded to a mother board.
Figure 19A:
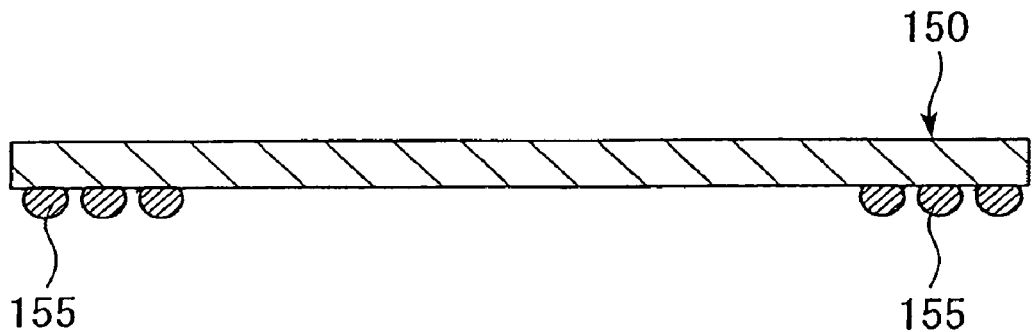
FIG. 19 is a sectional view showing a method of manufacturing the package substrate of the prior art.
Figure 19B:
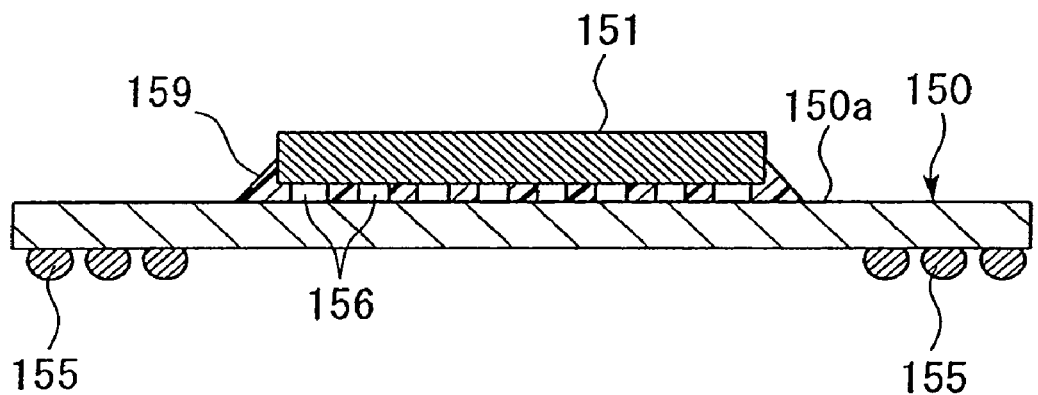
Figure 19C:
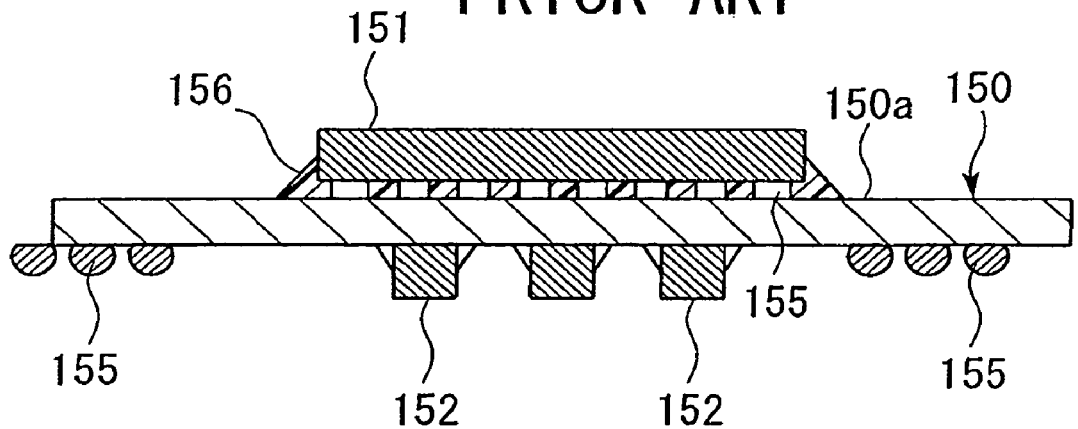
Figure 20:
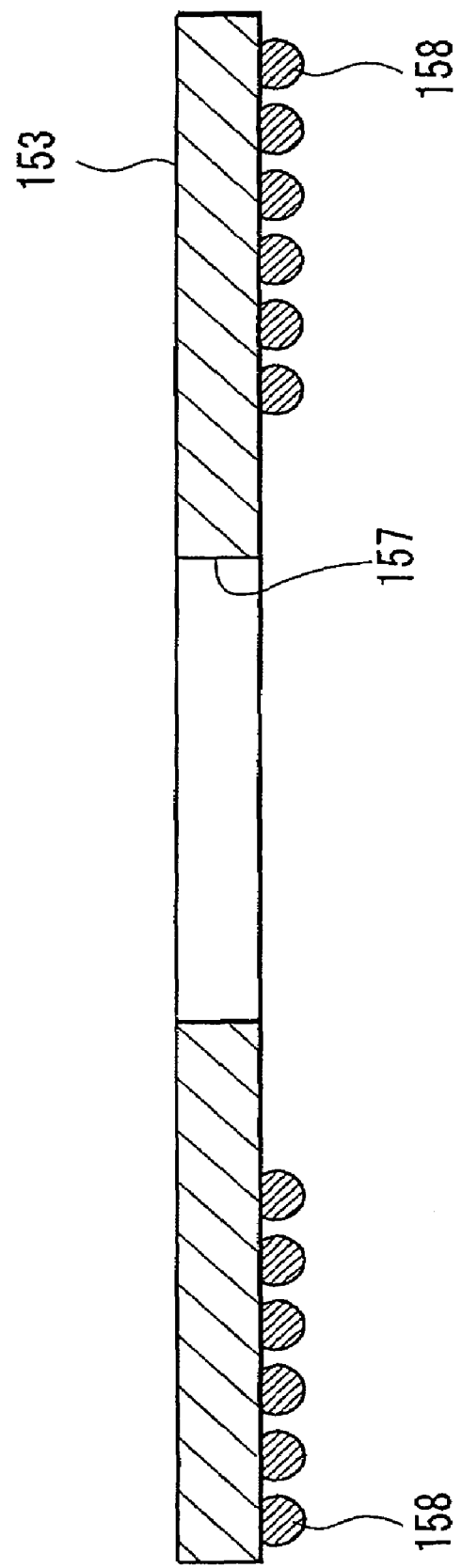
FIG. 20 is a sectional view showing a method of manufacturing the package substrate of the prior art.

FIG. 17 shows a state where the package substrate 3 (see FIG. 7) in the second embodiment is mounted on a mother board 70. The mother board 70 is formed with a hole 71. This hole 71 is disposed in alignment with the opening 11 formed in the parent board 12 of the package substrate 3.

A block 72 composed of a metal exhibiting a high thermal conductivity is inserted into the hole 71. This block 72 bonded to the sustaining member 30 of the package substrate 3 by a bonding agent 73 having the thermal conductivity.

Further, large-sized fins 74, 75 are disposed on both sides of the mother board 70. One fin 74 is bonded to the LSI 16 on the package substrate 3 by a bonding agent 73 having the thermal conductivity.

The other fin 75 is bonded to the block 72 inserted into the hole 71 of the mother board 70 by the bonding agent 73 having the thermal conductivity.

Moreover, a plurality of rods 76 penetrate through outer peripheral portions of the fins 74, 75 on both sides. A head 76a of the rod 76 is secured to one fine 75. Further, a spring 77 is inserted between a nut 76b screwed into the rod 76 and the other fin 74.

The fins 74, 75 on both sides are biased in such directions as to close to each other. Then, the mother board 70, the package substrate 3 and the block 72 are pressed by the fins 74, 75 on both sides.

Further, a material exhibiting a high thermal conductivity such as ceramics, diamond, etc. is mixed into the resin filling the opening 11 of the package substrate 3.

The LSI 16 is cooled off by the fin 74 bonded directly to this LSI 16. Further, the LSI 16 is cooled off by the fin 75 attached on the opposite side to this fin 74.

Namely, the LSI 16 is sufficiently cooled off by the fins 74, 75 on both sides. Accordingly, in the case of mounting the highly-exothermic LSI 16, the reliability thereof is improved.

Further, the invention includes the following notewise items.

In the invention, after laminating the second substrate on the first substrate, the hard resin fills the opening of the first substrate before the second electronic part is mounted on the second substrate, and this hard resin sustains the second substrate and the first electronic part mounted thereon.

The warp of the second substrate is thereby restrained, and the fixed or higher flatness is ensured. Accordingly, even in the case where the second substrate user, for instance, the thin film and the second electronic part user, for example, the LSI, the finely-formed wiring terminals of the LSI can be completely connected to the thin film. Therefore, the product yield is largely improved.

Further, in the invention, the hard resin fills the interior of the opening of the first substrate to the fixed or larger thickness and thus sustains the weights of the first and second electronic parts mounted on the portion facing the opening of the second substrate.

Accordingly, for instance, in the case where the highly-exothermic LSI is used as the second electronic part, the large-sized fin can be mounted on this LSI. The LSI can be thereby sufficiently cooled off, whereby the reliability is improved and the package substrate can be upsized.

What is claimed is:

1. A packaging method for electronic parts comprising:
   forming an opening in a first substrate;
   laminating a second substrate on the first substrate;
   covering the opening with the second substrate;
   inserting a first electronic part into the opening and bonding the first electronic part to the second substrate;
   filling an interior of the opening with a resin; and
   hardening the resin;
   wherein the first substrate and the first electronic part are thereby sustained by the resin, a second electronic part that should be connected to the first electronic part is bonded to a surface, on an exposed side, of the second substrate, and the first electronic part is connected to the second electronic part;
   wherein the first substrate includes a sustaining member provided within the opening, bonded to an inner peripheral surface of the opening and sustaining an exposed surface of the resin.

2. A packaging method for electronic parts according to claim 1, wherein the second substrate is a thin film.

3. A packaging method for electronic parts according to claim 1, wherein the first electronic part is a capacitor, and the second electronic part is an LSI.

4. A packaging method for electronic parts according to claim 1, wherein the resin contains a filler agent.

5. A packaging method for electronic parts according to claim 1, wherein a coefficient of thermal expansion of the resin is adjusted according to the first and second substrates, and the first and second electronic parts.

6. A packaging method for electronic parts according to claim 1, wherein a fin for cooling is bonded to the second electronic part.

7. A packaging method for electronic parts according to claim 1, wherein the second substrate has a stiffener for reinforcement.

8. A packaging method for electronic parts according to claim 7, wherein the stiffener is provided on the side of the first electronic part.

9. A packaging method for electronic parts according to claim 7, wherein the stiffener is provided on an outer peripheral edge of the thin film substrate.

* * * * *